United States Patent [19]
Woo

[11] Patent Number: 5,787,580
[45] Date of Patent: Aug. 4, 1998

[54] METHOD FOR MAKING RADIO-FREQUENCY MODULE BY BALL GRID ARRAY PACKAGE

[75] Inventor: Jun-Hwan Woo, Kyungsangbuk-do, Rep. of Korea

[73] Assignee: LG Information & Communications, Ltd., Seoul, Rep. of Korea

[21] Appl. No.: 752,416

[22] Filed: Nov. 19, 1996

[51] Int. Cl.[6] .................................................. H01R 9/06
[52] U.S. Cl. ................. 29/843; 228/180.21; 228/180.22; 228/215
[58] Field of Search ................ 29/843, 840; 228/180.21, 228/180.22, 215

[56] References Cited

U.S. PATENT DOCUMENTS

| | | | |
|---|---|---|---|
| 3,719,981 | 3/1973 | Stelz | 288/180.21 X |
| 4,830,264 | 5/1989 | Bitaillou et al. | |
| 5,024,372 | 6/1991 | Altman et al. | 228/215 X |
| 5,060,844 | 10/1991 | Behun et al. | 228/180.21 |
| 5,133,495 | 7/1992 | Anqulas et al. | |
| 5,203,075 | 4/1993 | Anqulas et al. | |
| 5,275,330 | 1/1994 | Issacs et al. | 228/180.21 |
| 5,442,852 | 8/1995 | Danner | |
| 5,477,933 | 12/1995 | Nguyen | |
| 5,504,277 | 4/1996 | Danner | |

Primary Examiner—Carl J. Arbes
Attorney, Agent, or Firm—Jacobson, Price, Holman & Stern, PLLC

[57] ABSTRACT

A method for making a RF module by a ball grid array package includes: perforating a feed-through hole which penetrates top and bottom surfaces of a terminal position of a chip populated on a substrate; forming a conductive line connecting top and bottom surfaces of said substrate into said feed-through hole; coating a part excepting a ball grid array pad on said conductive line with an insulator, by using emulsion mesh on said top surface of said substrate; making a stencil mask which provides a predetermined-sized aperture on a top surface of said ball grid array pad by using a metal mesh, and printing a solder paste on said ball grid array pad by using said stencil mask; and forming a ball grid array package solder ball through a reflow soldering of the solder paste in a nitrogen atmosphere. This method accuratly and easily forms a desired RF module without a solder printing process about a minute terminal pattern, thereby reducing a cost of production and preventing a poor product.

4 Claims, 3 Drawing Sheets

<SMD Type I/O leads>

<SMD Type I/O leads>

METHOD FOR MAKING RADIO-FREQUENCY MODULE BY BALL GRID ARRAY PACKAGE

BACKGROUND OF THE INVENTION (1.) Field of the Invention

The present invention relates to a method for making a radio-frequency (hereinafter referrred to as a RF) module by a ball grid array package. More particularly, it relates to a method for making a RF module by a ball grid array package which is suitable to a RF module having both low-weight and thinness.

(2.) Description of the Prior Art

Conventionally, as shown in FIG. 1A, surface mounting device (hereinafter referred to as a SMD)-type RF chips which are comprised of a RF element 12, a package 13 for protecting the RF element 12, and leads 11 for extending a terminal of the RF element 12 to outside of the package 13, are attached to an additional ceramic package, thereby modularizing the SMD-type RF module. Otherwise, as shown in FIG. 1B, leads 11 are attached to the side of an Input/Output (hereinafter referred to as an I/O) pad 16 of a SMD-type RF element 15, thereby modularizing the SMD-type RF module.

To populate the aforementioned SMD-type RF module on a printed circuit board (hereinafter referred to as a PCB), a stencil suitable to a terminal pattern of the RF module is attached to the PCB, thereby performing a solder printing. After that, the RF module is populated on the PCB being performed the solder printing by using a chip mounter, so that the RF module should be attached to the PCB through a reflow soldering process.

Accordingly, the method for making the SMD-type RF module according to the above prior art requires a solder printing process using a stencil of a pattern corresponding to a terminal pattern of a RF module. In this case, a poor solder bridge may occur if the terminal pattern is minute. In addition, the cost of production increases due to such solder printing process.

Typical Examples showing such a method for making a RF module are described in *'Ball Grid Array Technology'* written by John H. Lau, in 1995.

SUMMARY OF THE INVENTION

Accordingly, the present invention is directed to a method for making a RF module by a ball grid array package that substantially obviates one or more of the problems due to limitations and disadvantages of the prior art.

An object of the present invention is to provide a method for making a RF module by a ball grid array package which forms a ball grid array on the inside of ceramic substrate; connects a SMD-type RF module package with the ball grid array through a feed-through hole; reduces inductance by lowering a total height; and omits a solder printing process which is complicated, has a high possibility of poor products and causes a high-cost product, thereby reducing a cost of priduction.

In order to achieve this object, a method for making a RF module by a ball grid array package includes:

perforating a feed-through hole which penetrates top and bottom surfaces of a terminal position of a chip populated on a substrate;

forming a conductive line connecting top and bottom surfaces of the substrate into the feed-through hole;

coating a part excepting a ball grid array pad on the conductive line with an insulator, by using emulsion mesh on the top surface of the substrate;

making a stencil mask which provides a predetermined-sized aperture on a top surface of the ball grid array pad by using a metal mesh, and printing a solder paste on the ball grid array pad by using the stencil mask; and forming a ball grid array package solder ball through a reflow soldering of the solder paste in a nitrogen atmosphere.

BRIEF DESCRIPTION OF THE DRAWINGS

The preferred embodiment of the present invention will be described more specifically with reference to the attached drawings, wherein.

DETAILED DESCRIPTION OF THE PREFERRED EMBODIMENT

Reference will now be made in detail to the preferred embodiment of the present invention, examples of which are illustrated in the accompanying drawings.

Figure 1A:
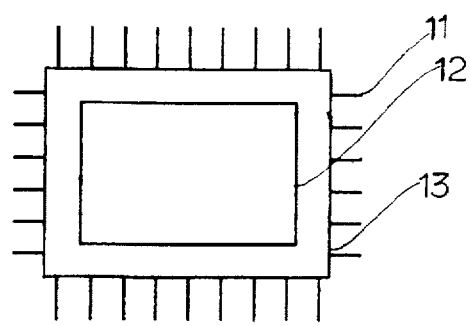
FIG. 1A shows a conventional RF module package which is modularized by using an additional ceramic package.
Figure 1B:
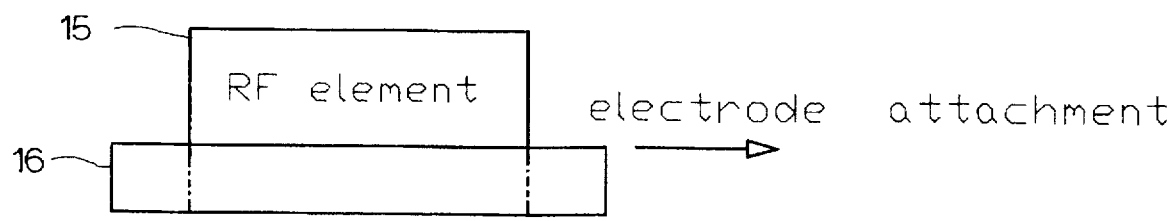
FIG. 1B shows another conventional RF module package which is modularized by forming an electrode on I/O pad.
Figure 2:
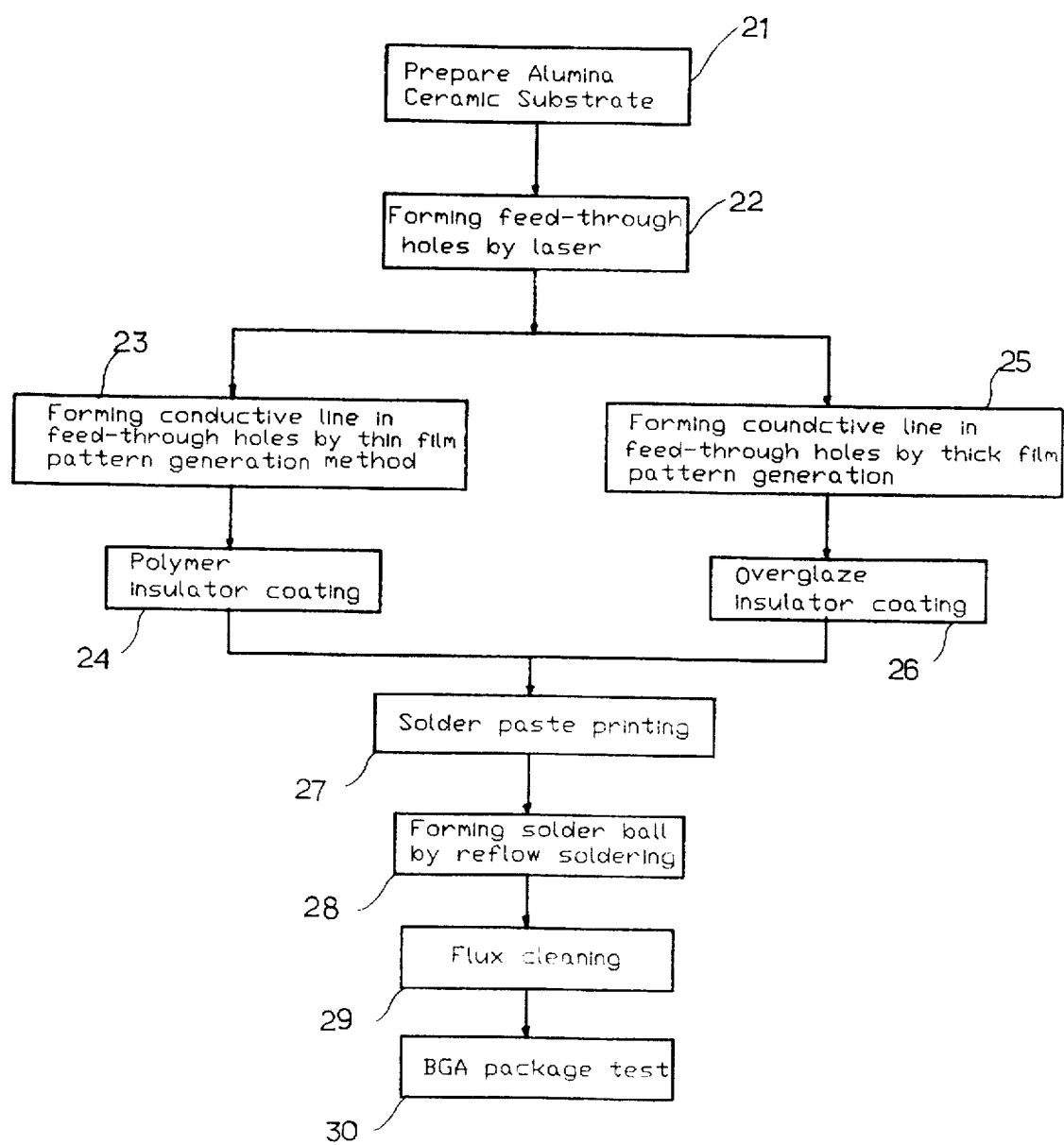
FIG. 2 is a flow chart illustrating a method for making a RF module by a ball grid array package in accordance with the present invention.
Figure 3A:
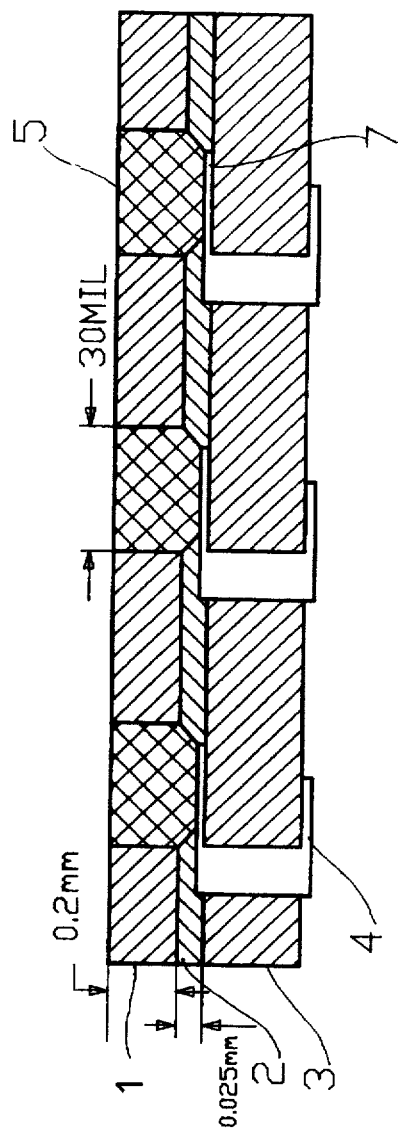
FIG. 3A shows a cross-sectional view illustrating a solder printing process in making a preferred embodiment applying a method for making a RF module by a ball grid array package in accordance with the present invention.
Figure 3B:
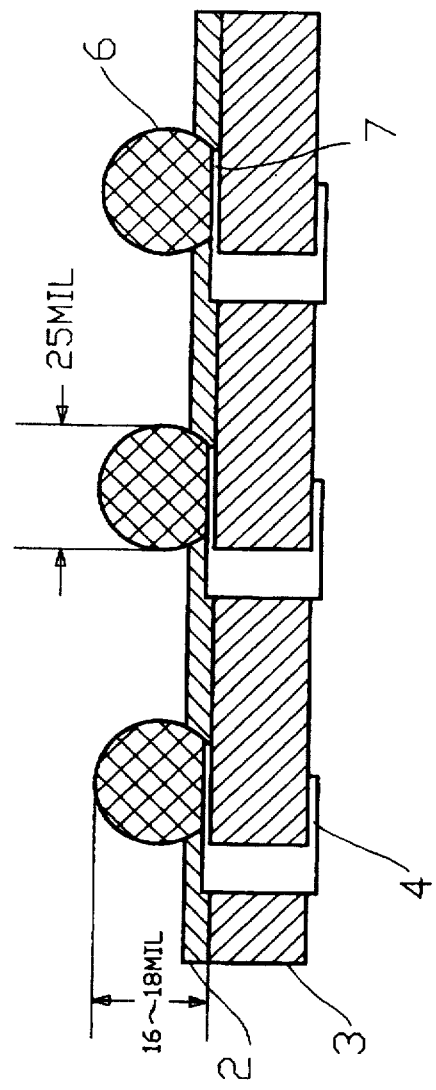
FIG. 3B shows a cross-sectional view illustrating a reflow soldering process in making a preferred embodiment applying a method for making a RF module by a ball grid array package in accordance with the present invention.

Referring to FIGS. 2 to 3B, in a first step of a method for making a RF module according to the present invention, a feed-through hole which penetrates top and bottom surfaces of a terminal position of a chip populated on a substrate 3 made of alumina ceramic is perforated by using, e.g., a $CO_2$ laser (STEPS 21 and 22). Components for forming the alumina ceramic substrate 3 are $Al_2O_3$, $SiO_2$, ZnO, and MgO.

Next, a conductive line 4 is formed (STEPS 23 and 25). Herein, the conductive line 4 is made of a conductive material, and connects top and bottom surfaces of the substrate 3 through the feed-through hole according to a thin film or thick film pattern generation method.

As to the thin film or thick film pattern generation method, more particularly, the thin film pattern generation method forms the conductive line 4 by electroplating an inner wall of the feed-through hole (STEP 23). The thick film pattern generating method forms the conductive line 4 by compulsorily pushing a conductive paste into the feed-through hole (STEP 25).

When forming the conductive line 4 by using the thin film pattern generation method after forming the conductive line 4, a remaining part excepting a ball grid array (hereinafter referred to as a BGA) pad 7 is coated with a polymer according to a screen printing method by using an emulsion mesh on top surface of the substrate 3, thereby forming an insulator 2 (STEP 24). Herein, the BGA pad 7 has a round shape of a proper diameter (e.g., about 28 MIL) in a part wherein the conductive line 4 is formed.

Meanwhile, in light of the same manner as a STEP 24, when forming the conductive line 4 by using the thick film pattern generation method after forming the conductive line 4, the remaining part excepting the BGA pad 7 is oveglazed according to a screen printing method by using an emulsion mesh on top surface of the substrate 3, thereby forming an insulator 2 (STEP 26).

Thereafter, a stencil mask 1 which has an aperture which is 0.2 mm in thickness and 30 MIL in diameter on the top surface of the BGA pad 7, is fabricated by using a metal mesh. A solder paste 5 for forming a solder ball 6 which achieves a ball grid array by using the stencil mask 1 is printed, so that it is transfered to the ceramic substrate 3 (STEP 27).

The solder paste 5 printed in the STEP 27 is processed by a reflow soldering in nitrogen atmosphere, thereby making a solder ball of which diameter is 25 MIL (STEP 28). Such a solder ball 6 has 16~18 MIL in thickness.

In addition, flux used in the STEPS 27 and 28 is cleaned (STEP 29).

Finally, a quality of the above-identified ball grid package is tested (STEP 30).

A coplanarity of about 5% between solder balls appears in the aforementioned present invention. A coplanarity is about 3.5% when populating a solder ball of about 30 MIL on the ceramic substrate. Accordingly, the coplanarity of about 5% is inferior as compared with another coplanarity of about 3.5%. However, there is few problem in a RF module having a small number of I/O pad.

Accordingly, the present invention is generally suitable to RF module package having a terminal of below 40 pins. A solder printing process is unnecessary when populating a RF module of the present invention on PCB, thereby reducing a cost of priduction and preventing a poor solder bridge. Especially, when a RF module fabricated by a BGA package according to the present invention is populated on the PCB and is assembled through a reflow soldering, the PCB and the BGA package have a lower height ranging from 12 MIL to 14 MIL. Therefore, the present invention is available for SMD element package of a RF module package which requires a thin package in order to suppress an increase of inductance due to a high-frequency signal.

It is understood that various other modifications will be apparent to and can be readily made by those skilled in the art without departing from the scope and spirit of the invention. Accordingly, it is not intended that the scope of the claims appended hereto to be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A method for making a RF module by a ball grid array package, comprising:

a step of forming a feed-through hole which penetrates top and bottom surfaces of a terminal position of a chip populated on a substrate;

a step of forming a conductive line connecting top and bottom surfaces of said substrate into said feed-through hole;

a step of coating a part excepting a ball grid array pad on said conductive line with an insulator, by using emulsion mesh on said top surface of said substrate;

a step of making a stencil mask which provides a predetermined-sized aperture on a top surface of said ball grid array pad by using a metal mesh, and printing a solder paste on said ball grid array pad by using said stencil mask; and a step of forming a ball grid array package solder ball through a reflow soldering of the solder paste in a nitrogen atmosphere.

2. The method according to claim 1, wherein said substrate is made of an alumina ceramic.

3. The method according to claim 1, wherein said conductive line is formed by a thin film pattern generation through an electroplating.

4. The method according to claim 1, wherein said conductive line is formed by a thick film pattern generation using a conductive paste.

\* \* \* \* \*